United States Patent [19]

Mallary et al.

[11] Patent Number: 5,089,334
[45] Date of Patent: Feb. 18, 1992

[54] FLUX SPREADING THIN FILM MAGNETIC DEVICES

[75] Inventors: Michael Mallary, Berlin; Harold B. Shukovsky, Framingham, both of Mass.

[73] Assignee: Digital Equipment Corporation, Maynard, Mass.

[21] Appl. No.: 227,808

[22] Filed: Aug. 3, 1988

[51] Int. Cl.$^5$ .................... G11B 23/00; H01F 10/08
[52] U.S. Cl. .................... 428/336; 428/611; 428/630; 428/692; 428/693; 428/694; 428/900; 428/928; 427/124; 427/131; 427/132; 360/110; 360/111; 360/112; 360/113; 360/119; 360/120; 360/121; 360/123; 360/125; 360/126; 360/127; 335/282
[58] Field of Search ............... 360/125, 126, 127, 110, 360/111, 112, 113, 119, 120, 121, 123; 428/692, 336, 611, 630, 693, 699, 900, 928; 427/124, 131, 132; 204/15; 335/282; 336/218

[56] References Cited

U.S. PATENT DOCUMENTS

| | | | |
|---|---|---|---|
| 3,549,825 | 12/1970 | Trimble | 360/123 |
| 3,880,602 | 4/1975 | Valin et al. | 29/195 |
| 3,947,889 | 3/1976 | Lazzari | 360/113 |
| 3,961,299 | 6/1976 | Lazzari et al. | 360/218 |
| 3,967,368 | 7/1976 | Brock et al. | 29/603 |
| 4,103,315 | 7/1978 | Hempstead et al. | 360/110 |
| 4,165,525 | 8/1979 | Koel et al. | 360/125 |
| 4,179,719 | 12/1979 | Imamura et al. | 360/112 |
| 4,223,360 | 9/1980 | Sansom et al. | 360/123 |
| 4,228,473 | 10/1980 | Himuro et al. | 360/114 |
| 4,242,710 | 12/1980 | Hempstead et al. | 360/113 |
| 4,335,410 | 6/1982 | Neu | 360/123 |
| 4,356,523 | 10/1982 | Yeh | 360/113 |
| 4,374,403 | 2/1983 | Oshima et al. | 360/113 |
| 4,376,337 | 3/1983 | Kobayasi et al. | 29/603 |
| 4,413,296 | 11/1983 | Jeffers | 360/113 |
| 4,535,375 | 8/1985 | Mowry et al. | 360/113 |
| 4,566,050 | 1/1986 | Beam et al. | 360/113 |
| 4,604,670 | 8/1986 | Visser | 360/127 |
| 4,613,918 | 9/1986 | Kanai et al. | 360/113 |
| 4,626,946 | 12/1986 | Vinal | 360/113 |
| 4,639,811 | 1/1987 | Diepers et al. | 360/125 |
| 4,649,447 | 3/1987 | Huang et al. | 360/113 |
| 4,656,546 | 4/1987 | Mallory | 360/110 |
| 4,663,685 | 5/1987 | Tsang | 360/113 |
| 4,668,913 | 5/1987 | Vinal | 324/235 |
| 4,695,351 | 9/1987 | Mallary | 204/15 |
| 4,698,711 | 10/1987 | Vinal | 360/113 |
| 4,750,072 | 6/1988 | Takagi | 360/126 |
| 4,803,580 | 2/1989 | Mowry | 360/113 |
| 4,816,947 | 3/1989 | Vinal et al. | 360/113 |
| 4,825,318 | 4/1989 | Hoo et al. | 360/121 |
| 4,891,725 | 1/1990 | Mowry | 360/113 |
| 4,912,584 | 3/1990 | Mallary et al. | 360/126 |

FOREIGN PATENT DOCUMENTS

| | | |
|---|---|---|
| 0114076 | 1/1984 | European Pat. Off. . |
| 0147126 | 12/1984 | European Pat. Off. . |
| 0154005 | 9/1985 | European Pat. Off. . |
| 0353911 | 7/1989 | European Pat. Off. . |
| 56-163517 | 12/1981 | Japan . |
| 57-141013 | 9/1982 | Japan . |
| 57-164416 | 10/1982 | Japan . |
| 61-229209 | 10/1986 | Japan . |

OTHER PUBLICATIONS

T. Maruyama et al.; A Yoke Magnetoresistive Head for High Density Recording; 1987 IEEE.
W. W. Chow; Multi-Turn Core and Winding for Thin (List continued on next page.)

Primary Examiner—Merrell C. Cashion, Jr.
Assistant Examiner—Stevan A. Resan
Attorney, Agent, or Firm—Fish & Richardson

[57] ABSTRACT

A method of flux conduction comprising providing a structure with anisotropy not purely in the transverse in-plane direction such that flux spreading into the transverse in-plane direction can occur by rotation.

This method of flux conduction is used in magnetic devices having coupled magnetic layers or coupled magnetic domains. Devices disclosed which utilize this method can function as a magnetic recording head, bubble memory, magnetic field structure, magnetic field sensor, transformer, laminated magnetic memory element or magnetic shield.

83 Claims, 5 Drawing Sheets

OTHER PUBLICATIONS

Film Inductive Head; IBM Corp. 1982; p. 4479.

Vinal, (IBM Technical Disclosure Bulletin, vol. 26, No. 7B, Dec. 1983).

Jeffers, "Magnetoresistive Transducer with Canted Easy Axis", IEEE Transactions on Magnetics, vol. Mag-15, No. 6, Nov. 1979, pp. 1628-1629.

Oshiki, "A Thin-Film Head for Perpendicular Magnetic Recording", J. Appl. Phys. 53(3), Mar. 1982, pp. 2593-2595.

Potter, "Self-Consistent Computer Calculations for Perpendicular Magnetic Recording", IEEE Transactions on Magnetics, vol. MAG-16, No. 5, Sep. 1980, pp. 967-972.

Shinagawa, "Simulation of Perpendicular Recording on Co-Cr Media with A Thin Permalloy Film-Ferrite Composite Head", J. Appl. Phys. 53(3), Mar. 1982, pp. 2585-2587.

Iwaski, "An Analysis for the Magnetization Mode for High Density Magnetic Recording", IEEE Transactions on Magnetics, vol. MAG-13, No. 5, Sep. 1977, pp. 1272-1277.

Mallary et al., "Frequency Response of Thin-Film Heads with Longitudinal and Transverse Anisotropy", IEEE Transactions on Magnetics vol. 26, No. 5, Sep. 1990, pp. 1334-1336.

Mallary et al., "Three-Dimensional Transmission Line Model for Flux Conduction in Thin-Film Recording Heads", J. Appl. Phys. 67(9), May, 1990, pp. 4863-4865.

Mallary et al., "Conduction of Flux at High Frequencies by a Charge Free Magnetization Distribution", IEEE Transactions on Magnetics, vol. 24, No. 6, Nov. 1988, pp. 2374-2376.

Michael L. Mallary, Conduction of flux at high frequencies in Permalloy strips by small-angle rotations; J. Appl. Phys. 57(1) 15 Apr., 1985; 3952-3954.

John C. Slonczewski, Bojan Petek, Bernell E. Argyle; IEEE Transactions on Magnetics, vol. 24, No. 3; May 1988; 2045-2053.

FLUX SPREADING THIN FILM MAGNETIC DEVICES

BACKGROUND OF THE INVENTION

The present invention relates to rotational flux conduction in thin film magnetic devices.

Magnetic devices, such as thin film recording heads, whether read, read/write, or write, are designed to have particular magnetic orientations, or domains, within the active regions of the device material. The static state of each of these domains can be oriented along a given axis, known as the easy axis (or axis of anisotropy), as desired, by control of the manufacturing process. Performance is critically linked to domain formation, and, therefore, control can be exerted over device performance by controlling domain formation.

Conduction of flux, such as in a thin film recording head, is achieved by two mechanisms: domain wall motion and domain rotation. Domain wall motion results in flux being transmitted through a thin film head along the walls of a domain, or domains, the flux spreading out along the domain walls as the flux seeks to return to equilibrium. However, while domain wall motion facilitates conduction of flux at low frequencies, it is a poor vehicle for conduction of flux at high frequencies. Furthermore, defects in the material in a magnetic head can be the source of Barkhausen noise during conduction of flux by wall motion as the flux is perturbed by these defects. Such noise can result in erroneous readings of recorded data.

A conventional prior art pole of a magnetic recording head is shown in FIG. 1(a), where medium M will be seen as inserting signal flux into a first transversely oriented domain dl of a series of transversely oriented domains dl-dn. The rest state flux of the domains is in the X-axis (transverse direction), which leaves a rotational option of flowing into the Y axis (longitudinal direction) or Z axis (vertical direction) in reaction to the signal flux from the medium. The Z-axis is out of plane and is a high reluctance path. Hence the flux will rotate into the Y-axis, as indicated by the rotated arrows of each of domains dl-dn.

In view of the foregoing, it will be understood that conduction of flux by domain rotation may be achieved by configuring a series of neighboring transverse domains axially aligned along parallel axes, where signal flux impinged upon the first domain at a given angle will cause the magnetization of that domain to rotate from its static orientation by that angle radially into and impinging upon the neighboring domain. Such rotation can be transmitted in a like manner along an axis of flux transmission by each neighboring domain of the series. Hence, flux can be conducted in the pole and through the yoke of a thin film head in a series of domain rotations. The yoke enables conduction of flux through a transducer which produces electrical signals proportional to flux levels or the rate of flux change. The transducer might be an induction coil or other flux sensing device. An induction coil is shown schematically in FIG. 1(a) as it might overlie the bottom pole of a two pole structure.

Further discussion of the flux conduction mechanisms will be found in co-pending patent application entitled: "Perpendicular Anisotropy In Thin Film Devices", U.S. Ser. No. 07/227,813, filed Aug. 3, 1988, which is incorporated herein by reference.

SUMMARY OF THE INVENTION

One aspect of the present invention relates to a method and apparatus for providing rotational flux spreading into the transverse in-plane direction in a flux conduction structure with a preferred rest state not purely in the transverse in-plane direction.

One feature of the invention is to enable rotational flux spreading in the yoke of a magnetic device.

In one preferred embodiment of the invention, a magnetic device has an axis of preferred rest state not purely in the transverse in-plane direction, such that flux spreading into the transverse in plane direction can occur by rotation.

In some embodiments of the present invention, a magnetic conduction device has two active layers capable of both longitudinal and lateral flux conduction by rotation. These layers are sufficiently isolated from each other at rest such that the domain state of one layer is independent of the other. However, the layers are sufficiently coupled to each other such that signal flux can readily flow therebetween.

In other embodiments of the present invention, the gap between the two layers is small enough to pass rest state domain flux. Also, the preferred orientation of the two layers is mainly transverse but is canted at angles of $+/-$ theta relative to the transverse direction. The coupling of the signal flux between these two layers allows the flux to spread in a wedge with an opening angle of about twice theta for small signal levels.

In still other embodiments of the present invention, four active magnetic layers (A, B, C and D) comprise two pairs of layers (AB and CD). The layers A and B are oriented in the same direction and the gap between A and B is small enough to couple rest state domain flux between them. The layers C and D are similarly configured but their orientation is at a different angle. The gap from B to C is large enough to not conduct rest state domain flux but small enough to conduct signal flux. For example, A and B could be longitudinally oriented while C and D are transversely oriented. Alternatively, A and B could be oriented at plus theta to the transverse direction while C and D are at minus theta.

In yet other embodiments of the present invention having three active layers (A, B and C), A and B are paired as described above and are transversely oriented The gap from B to C is large enough to block rest state domain flux but small enough to conduct signal flux. Layer C is oriented longitudinally. The pair A and B conducts flux longitudinally even for narrow track widths. The layer C spreads the flux laterally thus to avoid the high impedance flux beam effect. Alternatively A and B would be oriented longitudinally and could be oriented transversely.

Other advantages and features will become apparent from the following description of the preferred embodiment and from the claims.

DESCRIPTION OF THE PREFERRED EMBODIMENTS

We first briefly describe the drawings.

It is desirable that signal flux be efficiently conducted from the pole tip through the yoke of a magnetic conduction device. Thus a low reluctance flux conduction mechanism is desired. The present invention enables low reluctance flux conduction by magnetization rotation at high frequencies. This is achieved by provision of a structure allowing both longitudinal and lateral rotational conductivity Such multi-dimensional conductivity obviates the need for domain wall propagation, thus avoiding low response at high frequencies and Barkhausen noise The invention is applicable to a wide variety of devices relying upon magnetic conduction, including transformers, magnetic field sensors, bubble memory magnetic structures, thin film magnetic memory elements, magnetic shields, and recording heads, and may be embodied in both single and multi-layered devices.

Figure 1A:
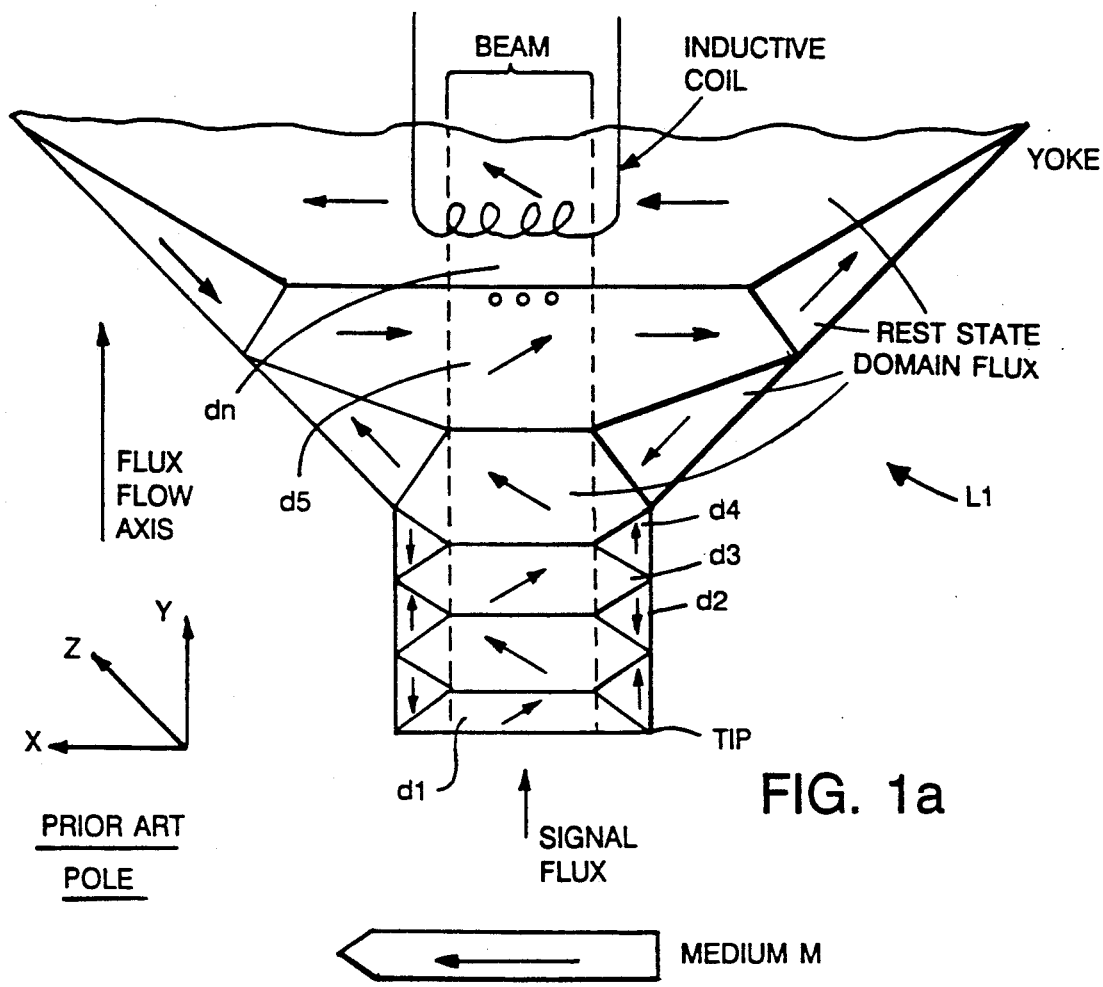
FIG. 1(a) is a schematic view of the top layer of a prior art pole.
Figure 1B:
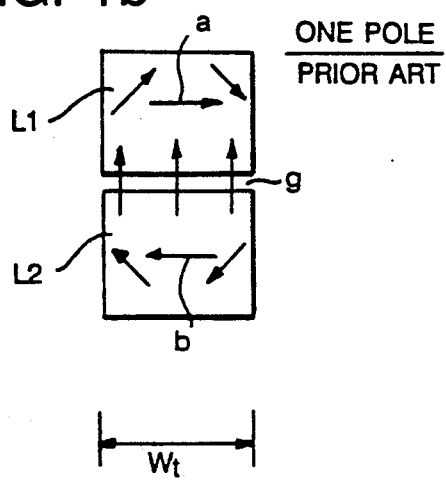
FIG. 1(b) is a cross-sectional view of a two layer configuration of the prior art pole of FIG. 1(a).

FIG. 1(b) shows in cross section a two-layer configuration of a prior art pole. Here, layers L1 and L2 are separated by a very narrow gap g to enable coupling between layers L1, L2 of rest state domain flux (i.e., D.C. flux of the domains at rest). The anisotropy directions of layers L1, L2 are parallel to each other and transverse to the pole, as indicated by the horizontal arrows a, b in layers L1, L2, respectively. Also, the thicknesses of L1 and L2 are by design equal.

Figure 2:
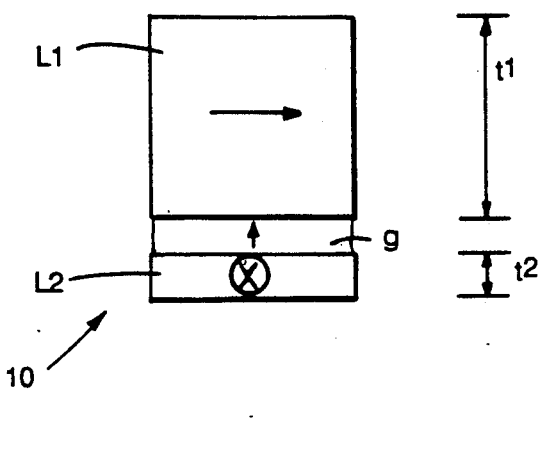
FIG. 2 is a schematic of a two layer pole of a preferred embodiment of the present invention.

Turning to the schematic drawing of FIG. 2, a preferred embodiment of the present invention is shown from a magnetic recording medium looking into the tip of a pole 10 of a magnetic recording head having two active layers, L1, L2, one with in-plane anisotropy (i.e., rest state domain orientation) transversely oriented, and the other layer longitudinally oriented These layers are separated by a gap layer g. The gap layer is thick enough such that the domain state of each layer will remain independent from each other, but yet is thin enough such that signal flux can transmit readily between the two layers of the pole. In present thin film configurations, perhaps a range of three hundred to two thousand angstroms would be a reasonable target for gap size. In a typical two pole recording head, each pole could have a like configuration. Layers L1 and L2 are preferably configured where L1 thickness t1 does not equal L2 thickness t2. These layers are preferably configured with t1 greater than t2.

Figure 3:
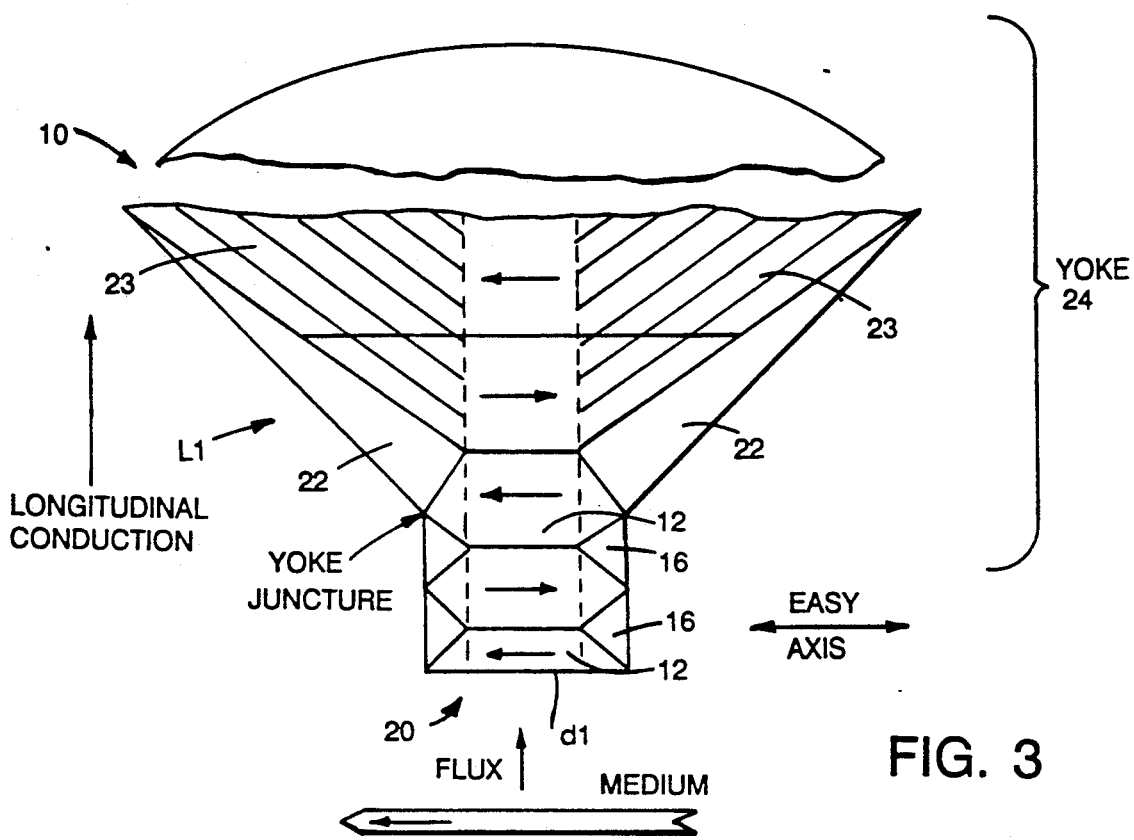
FIG. 3 is a schematic of the top layer of the pole of FIG. 2.

A top view of pole 10 of FIG 2 is shown in FIG. 3, where the first layer L1 of pole 10 has a preferred easy axis transverse to the longitudinal axis of the pole. The domain structure is configured to have relatively large and uniform central domains 12 with adjacent relatively small edge domains 16 in the region of pole tip 20, and with extended edge domains 22 in the yoke region 24. In this configuration, flux from the medium will be read at the first domain d1 at pole tip 20. As a result, flux will be conducted by rotation, serially propagating down adjacent domains 12, as it heads toward yoke section 24. This conducting mechanism may be referred to as a flux pipe or flux beam, and is schematically indicated by the parallel vertical dotted lines running up the pole from the tip and through the yoke.

Figure 4:
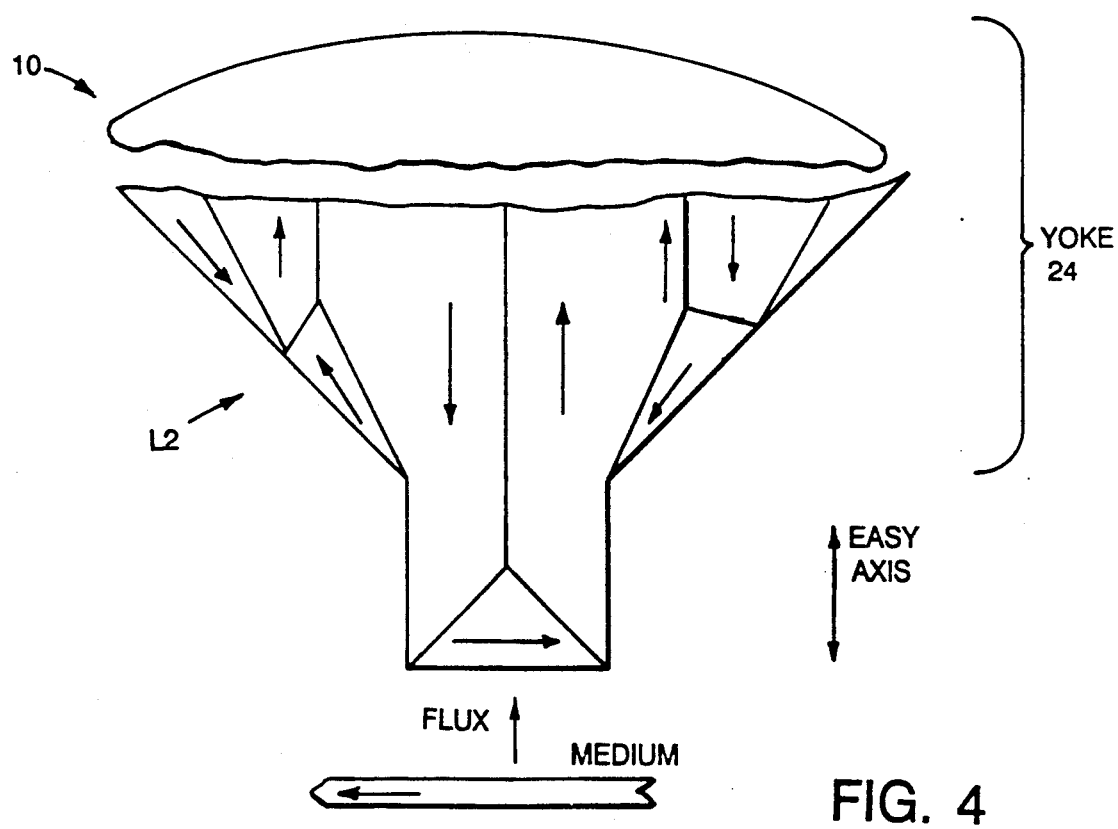
FIG. 4 is a schematic of the bottom layer of the pole of FIG. 2.

A top view of layer L2 of FIG. 2 is shown in FIG. 4. Layer L2 has a longitudinal easy axis, parallel to the longitudinal axis of the pole and transverse to the easy axis of layer L1. The domain structure is substantially longitudinal in orientation. As a result it will conduct flux transversely by rotation.

In FIGS. 3 and 4, the yoke section 24 is shown to increase in width as it extends away from pole tip 20. If the yoke section were not spread, the boundaries of the flux beam would be defined as shown in dotted lines and the high reluctance effect mentioned above would degrade operation. However, by having this region spread out, the flux beam will somewhat spread out, thus adding to the area within the dotted lines by including at least a portion of the regions indicated by the hash marks 23. This effectively results in a lower reluctance path of conduction through the yoke.

It should be appreciated, however, that mere broadening of the yoke alone is not sufficient to accomplish substantial flux spreading in this embodiment. Rather, it is the cooperation between differently oriented layers $L_1$, $L_2$ of pole piece 10, which facilitates substantial flux spreading, and the yoke is broadened therefore to facilitate interaction of these layers. A more detailed description of the flux spreading mechanism as applied to the embodiment of FIGS. 2, 3 and 4 follows.

Flux will be introduced from the magnetic medium into the first transverse domain d1 domain at pole tip 20 perpendicular to the easy axis of the transversely magnetized layer L1. The flux will be propagated longitudinally by rotation down that layer, domain 12 to domain 12, for as long as a low path of reluctance is experienced by the flux. As path length and thus reluctance accumulates, a portion of the flux crosses the gap g and propagates into the longitudinally oriented domain L2, thus lowering the reluctance of the system. The flux will propagate transversely in layer L2 until it accumulates reluctance as will cause it to seek a path of lower reluctance and to jump the gap to re-enter into the transverse layer L1. Once in the transverse layer, the flux propagates longitudinally until accumulated reluctance again causes the flux to seek a lower path of reluctance in the longitudinal active layer on the other side of the gap. This process will continue until the flux has propagated through the yoke, but by the virtue of the process of adding a transverse rotational component to flux flow, the flux will have spread out within the widened yoke region, thus reducing total system reluctance.

Thin film heads are being used at higher bit densities. One way to achieve this higher bit density is by reduction of track width. Hence, it is desirable to produce a thin film head having a narrow track width but which also operates at high frequencies. Conduction by rotation can enable such achievements.

A narrow track should have a high anisotropy field. This high anisotropy field will act to keep the flux path open by keeping edge domains relatively small. As a result, the rotational mechanism may be kept alive even where the structural magnetic reluctance is lowered in the yoke section according to the present invention, although the high anisotropy field will reduce permeability of the structure.

In the design of a narrow track, laminated films often are used to eliminate edge domains and 180° walls. Therefore, these laminated films will not spread flux well in conventional configurations.

Figure 5:
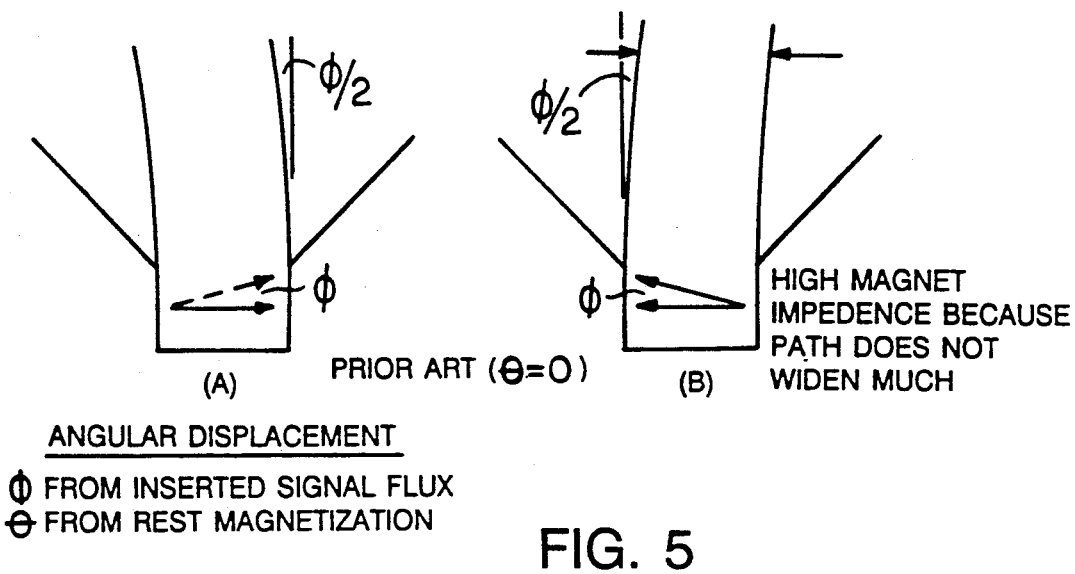
FIG. 5 is a schematic in two views of a unidirectional anisotropy prior art head.

Referring to FIG. 5 (A and B), which includes schematic complementary views of a unidirectional anisotropy prior art head not having the cooperating layers of the present invention, it will be seen that the flux imposed at an angle phi (or 180° minus phi) from the medium upon the transversely oriented magnetization will cause a rotation of the magnetization by such angle. In all other aspects a uniform beam will be conducted back through the pole into and through the yoke, except that it will be canted by one half of phi. As a result, a high magnetic impedance will be experienced at the yoke because the flux beam does not widen significantly.

Figure 6C:
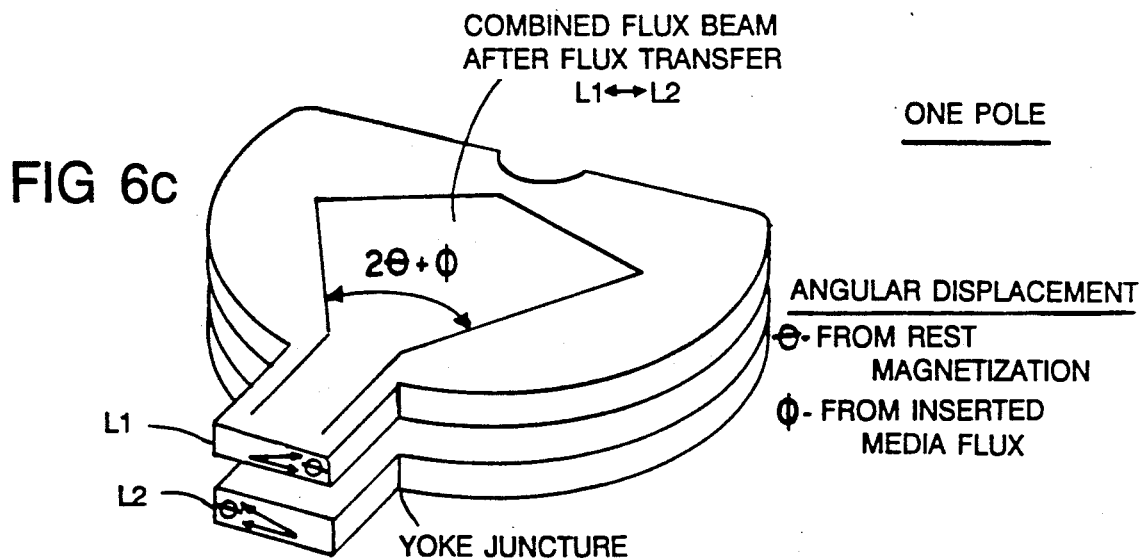
FIGS. 6a, 6b and 6c are three schematic views of an alternative embodiment of the present invention showing a flux beam comprised of angular and rotational components.
Figures 6A, 6B:
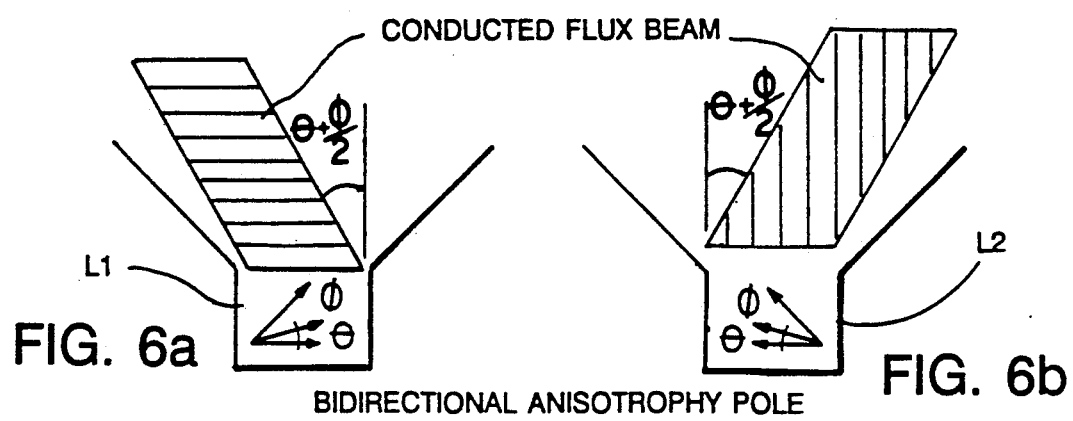

The present invention, in an alternative preferred embodiment, achieves flux spreading by orienting the easy axes of the top and bottom layers of laminated poles at plus and minus angles, theta, relative to the transverse magnetic direction. As a result, the flux will then spread out in a wedge angle of twice the value of theta, plus the additional angular component phi caused by the flux rotation. The wedge creating embodiment of the present invention is shown conceptually in FIG. 6 (A, B and C), where in 6A the first active layer L1 has been imparted a static angular displacement of its magnetic orientation at an angle theta measured from the transverse axis. The second active layer L2 is shown in 6B having a complementary magnetic orientation at rest at an angle 180° minus theta. When flux is impinged upon the L1 and L2 layers normal to the transverse axis, then the resulting flux beam will be spread equivalent to twice theta plus the rotational component phi for each layer (i.e., one-half phi plus one-half phi). Thus, the flux beam will be the summation of the two angularly and rotationally displaced flux beams of each layer, amounting to two theta plus phi, as shown in 6C. It is preferred in this configuration that the gap between the two layers is small enough to pass rest state domain flux.

In operation, flux from the magnetic medium will enter the pole tip and be conducted back to the yoke juncture by rotation in both layers. As the flux enters the yoke juncture, the top layer directs a flux beam off at an angle theta relative to the axis of symmetry of the pole, and the bottom layer directs the flux beam off at an angle 180° minus theta. Conduction of flux between the layers allows the top layer to insert flux into the bottom one in positive theta regions and vice versa.

Figure 7:
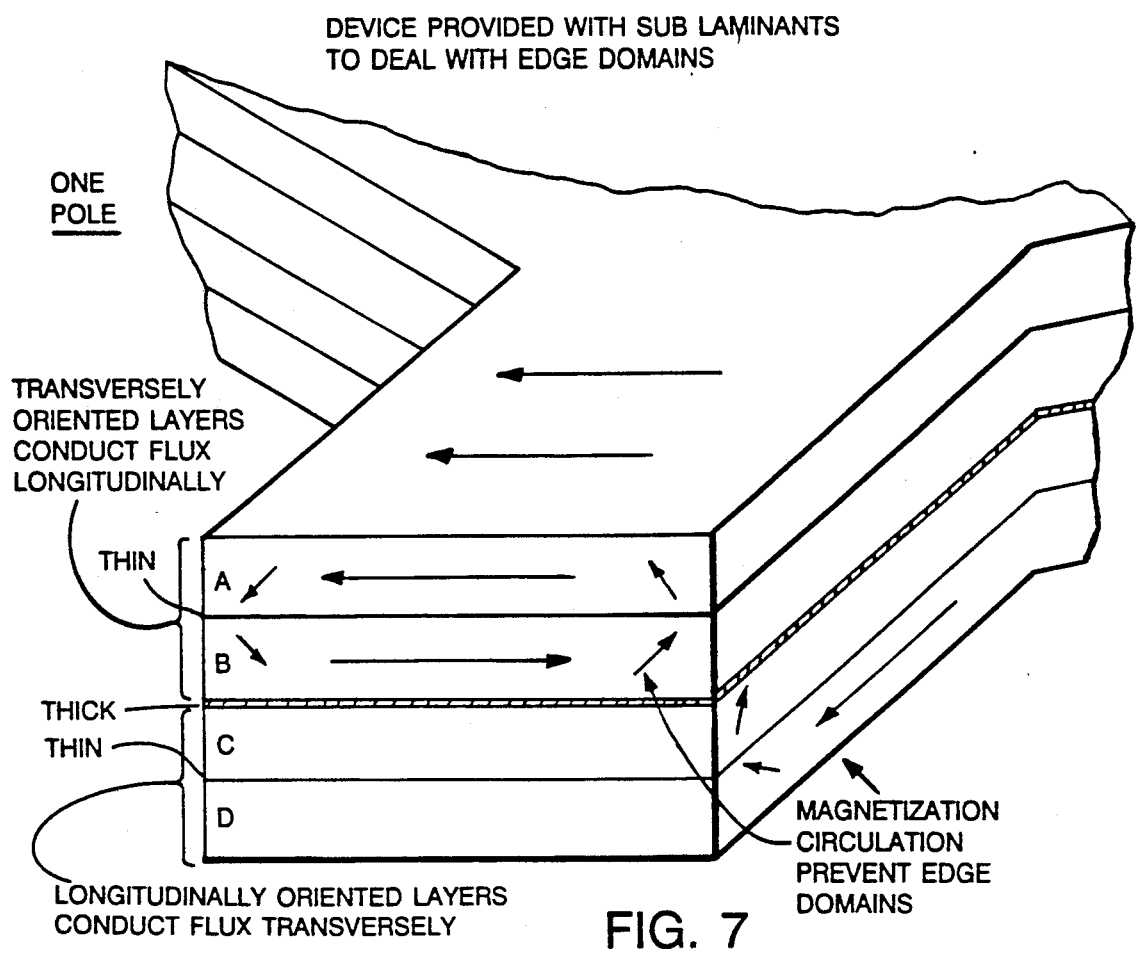
FIG. 7 is a schematic of an alternative laminated embodiment of the present invention having two layers, each layer having a parallel sublayer.

In other embodiments of the invention utilizing laminated films, two or more active magnetic layers can be employed. In a particular embodiment, one pole of which is illustrated in FIG. 7, four active magnetic layers (A, B, C and D) comprise two pairs (AB and CD) of layers. The layers A and B are oriented in the same direction and the gap between A and B is small enough to couple rest state domain flux between them. The layers C and D are similarly configured but their orientation is at a different angle. The gap from B to C is large enough to not conduct rest state domain flux but small enough to conduct signal flux. For example, A and B could be longitudinally oriented while C and D are transversely oriented. Alternatively, A and B could be oriented at plus theta to the transverse direction while C and D are at 180° minus theta.

An alternative configuration of the embodiment of FIG. 7 is provided having three active layers (A, B and C), A and B are paired as described above and are transversely oriented. The gap from B to C is large enough to block rest state domain flux but small enough to conduct signal flux. Layer C is oriented longitudinally. The pair A and B conducts flux longitudinally even for narrow track widths. The layer C spreads the flux laterally thus to avoid the high impedance flux beam effect. Alternatively, A and B could be oriented longitudinally and C could be oriented transversely.

Figure 8:
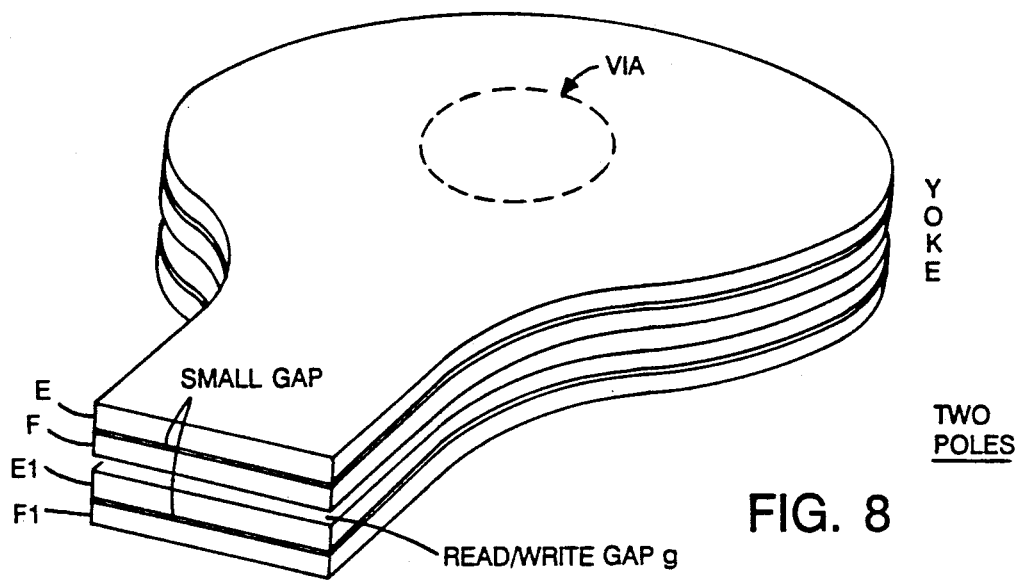
FIG. 8 is a conventional laminated two pole geometry.

FIG. 8 shows a conventional two pole yoke geometry where the top and bottom halves of the yoke are symmetrical, and the tips are centered about gap g. The foregoing configurations of the invention can be applied to this geometry. By doing so, flux spreading by rotation will be achieved while preserving flux conduction by rotation in the longitudinal direction. Each pole is shown to have been laminated into two active magnetic layers E,F and E1,F1.

Figure 9:
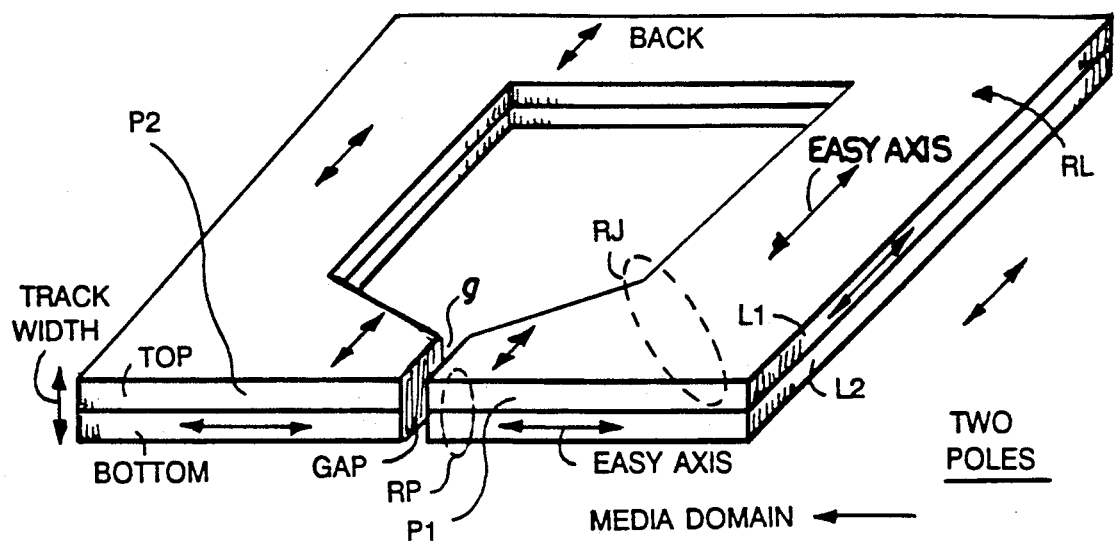
FIG. 9 is a schematic of an alternative embodiment of the present invention where poles P1 and P2 are in the same horizontal plane.
Figure 10:
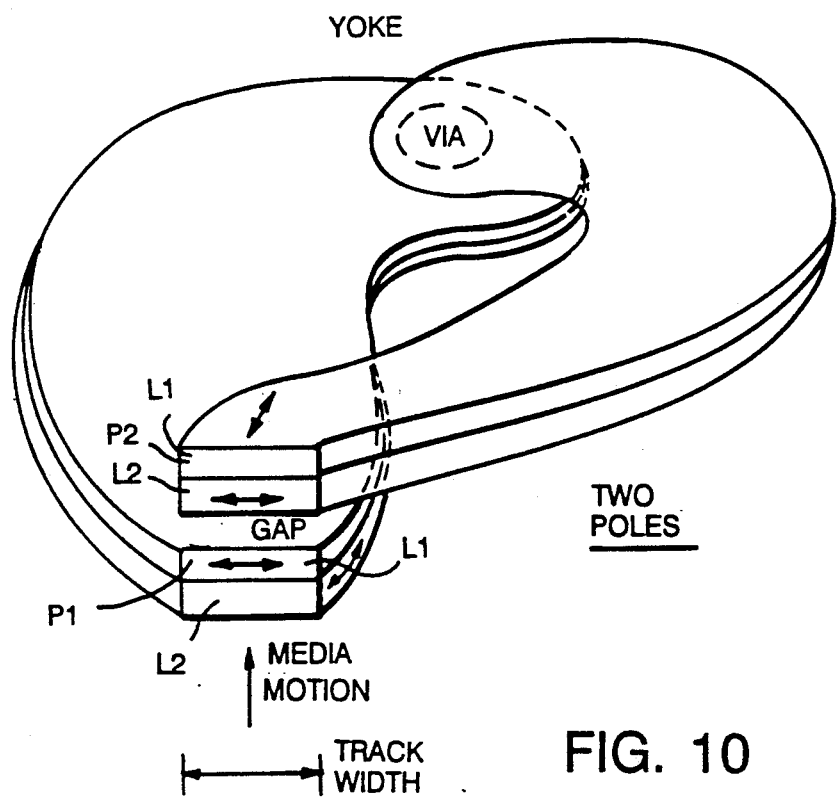
FIG. 10 is a schematic of another alternative embodiment of the present invention where poles P1 and P2 are stacked.

These above-described configurations of the invention can also be applied to the geometries shown in FIGS. 9 and 10. Here, the invention not only aids in flux spreading by rotation, but also facilitates transverse flux conduction by rotation. For example, in the configuration shown in FIG. 9, poles P1 and P2 are horizontal. Their first layer L1 is longitudinally oriented. Layer L2 is transversely oriented. Flux entering the right hand pole tip near the gap in region RP is initially conducted to the right in the top longitudinally oriented layer. When the flux reaches the juncture with the right hand leg in region RJ, it will transfer to the bottom layer and be conducted toward the back of that pole in that transversely oriented layer. When the flux reaches the back section of the yoke, it must jump back into the top layer in order to travel leftward by rotation. The flux travels in a complementary manner to complete the flux path back to the left hand pole tip.

In FIG. 10, poles P1 and P2 are stacked. The first layer L1 extends over each pole and is longitudinally oriented Layer L2 is transversely oriented and extends over each pole. Vias are provided in the yoke to assure coupling between respective portions of each layer. In this embodiment, the same process occurs as in the embodiment of FIG. 9, but the turns on the path are not abrupt. Also, the pole tips are stacked.

It will be appreciated that a transducer must be associated with the yoke in order to generate electrical signals from the signal flux in the device. Various transducer configurations would be operable with practice of the present invention.

Manufacturing

In a dry vacuum deposition approach, the transversely oriented layer can be deposited on a wafer substrate by placing the wafer in a transversely oriented magnetic field during deposition. (Alternately, this can be accomplished by growing the film with a crystal orientation that places a crystallographically oriented axis in the transverse direction.)

The transversely oriented magnetic field can be supplied by coils or by the magnetron target magnets of a sputtering machine, for example. Also, the deposition can be made at angles normal or other than normal to the surface, where the incident direction establishes the preferred axis. For example, one layer might have a field direction at plus theta to the transverse direction, and the other layer might be oriented at minus theta. During subsequent heat treatment, exclusion of all fields would allow the two layers to self bias. Furthermore, in a configuration where an external transverse field is needed to be present to orient other head layers, then the easy axis in both layers could be established at some angle greater than theta, such that after anneal they would relax to angle theta.

After the first layer is laid down, then a buffer layer (non-magnetic) can be deposited. For dry deposition, it is convenient to use a ceramic which can be made thinner than a metal and will stop exchange coupling between the first and the next layer. In orthogonal configurations, for example, the second magnetic layer will be deposited either with the wafer rotated 90° to the first deposition position, or the magnetic field rotated 90°. After these layers are deposited, the yoke may be formed by means of a masked ion milling process.

Where it is believed advantageous to sub-laminate each of the oriented layers, orientation direction of magnetization in the sublayers paired together preferably would be in the same direction. It may be found that dry deposition is more suited to this type of heavily laminated structure.

For wet processing, each layer is deposited through a plating mask in a bias field to establish appropriate magnetic domain orientation. The non-magnetic layer can be plated if it is a metal, for example Ni-P, Au, Cu, etc. If a ceramic is used for the buffer layer, then this must be sputtered after the mask has been removed. The structure is now ready to receive the next magnetic layer, whereupon a seed layer and mask will be laid down, and the layer will be plated thereon.

A problem with the technology described above resides in that any exposure to very high temperatures (for example, greater than 200° C. for greater than half an hour for NiFe poles) will degrade the induced anisotropy obtained by depositing in a field. This sensitivity can be overcome by using the angle of incidence approach to inducing anisotropy as discussed above in regard to dry deposition. In particular, it is possible to deposit the first layer of the bottom of the yoke in a longitudinally oriented field. This layer can be annealed in the field at a temperature that is much higher than the process temperatures used in the rest of the process. Next, the top layer of the bottom of the yoke and the bottom layer of the top of the yoke may be deposited in a transverse field, which field is maintained during high temperature processing. Thereafter the top layer of the top yoke may be deposited in a longitudinal field and which is not annealed. Only the bottom layer then has experienced an anisotropy-lowering anneal, and it will retain only some of its orientation. Nevertheless, orientation of this lowest layer, while important for yoke conductivity, is not critical for pole tip conductivity, and therefore such conductivity can be diminished.

Other embodiments are within the following claims.

Pole materials which may be used in the above processes include alloys of nickel, iron and cobalt, and magnetic garnet and ferrite crystals, to name a few alternatives.

What is claimed is:

1. A magnetic device for conducting signal flux therethrough, comprising:

a first region for conducting said signal flux in a first direction, said first region including a first plurality of magnetic domains oriented transversely to said first direction to cause said signal flux to conduct by rotation in said first direction, a second region for conducting said signal flux in a second direction different from said first direction, said second region including a second plurality of magnetic domains oriented transversely to said second direction to cause said signal flux to conduct by rotation in said second direction, and said first and second regions being coupled to each other to allow said signal flux to pass between said regions and follow said first and second directions so that said signal flux conducts by rotation through said device.

2. The device of claim 1, further comprising at least two magnetic layers, said first region being disposed in said first layer and said second region being disposed in said second layer, said layers being separated from each other to avoid flux conduction between said first plurality of magnetic domains and said second plurality of magnetic domains when said signal flux is absent.

3. The device of claim 1, further comprising at least two magnetic layers, said first region being disposed in said first layer and said second region being disposed in said second layer, said layers being coupled together to allow flux conduction between said first plurality of magnetic domains and said second plurality of magnetic domains when said signal flux is absent.

4. The device of claim 2, wherein said first layer comprises two parallel magnetic layers.

5. The device of claim 3, wherein said first layer comprises two parallel magnetic layers.

6. The device of claim 2, wherein said second layer comprises two parallel magnetic layers.

7. The device of claim 3, wherein said second layer comprises two parallel magnetic layers.

8. The device of claim 2, wherein said first layer comprises two parallel magnetic layers and said second layer comprises two parallel magnetic layers.

9. The device of claim 3, wherein said first layer comprises two parallel magnetic layers and said second layer comprises two parallel magnetic layers.

10. The device of claim 1, wherein said first plurality of said magnetic domains and said second plurality of said magnetic domains are oriented perpendicularly to each other.

11. The device of claim 1, wherein said first plurality of said magnetic domains and said second plurality of said magnetic domains are oriented obliquely to each other.

12. The device of claim 1, wherein said first plurality of magnetic domains and said second plurality of magnetic domains are each capable of conducting flux in said first and said second directions.

13. The device of claim 1 constructed as a magnetic transducer having a pair of magnetic poles for conducting said signal flux from a storage medium to a yoke section of said transducer, said first region comprising a first one of said poles and said second region comprising a second one of said poles, said magnetic poles being coupled together in said yoke section and having tips that are stacked one upon the other, separated by a gap, and arranged to be disposed adjacent to said storage medium.

14. The device of claim 1 constructed as a magnetic transducer having a pair of magnetic poles for conducting said signal flux from a storage medium to a yoke section of said transducer, said first region comprising a first one of said poles and said second region comprising a second one of said poles, said magnetic poles coupled together in said yoke section and having tips that are separated by a gap and arranged to be disposed adjacent to said storage medium, said poles being coplanar and disposed adjacent to each other.

15. The device of claim 1 constructed as a magnetic recording head, wherein said first region and said second region are respectively arranged to provide two poles of said head that are disposed on a common plane of deposition.

16. The device of claim 1 constructed in a transformer, wherein said first region and said second region are arranged to provide a laminated yoke of said transformer.

17. The device of claim 1 constructed as a magnetic field sensor, wherein said first region and said second region are arranged to provide a laminated magnetic structure for detecting and conducting flux applied to said sensor.

18. The device of claim 1 constructed as a bubble memory magnetic field structure, wherein said first region and said second region are arranged to provide at least one laminated memory element thereof.

19. The device of claim 1, wherein said first region and said second region are arranged to provide a laminated magnetic memory element.

20. The device of claim 1, wherein said first region and said second region are arranged to provide a laminated magnetic shield.

21. A magnetic device for conducting signal flux therethrough, comprising:
 first magnetic domains oriented to conduct said signal flux by rotation in a first direction in a plane of said device,
 second magnetic domains oriented to conduct said signal flux by rotation in a second, different direction in said plane of said device, and
 said first domains and said second domains being coupled to each other to cause said signal flux to pass therebetween and follow said first and second directions so that said signal flux conducts by rotation through said device.

22. A magnetic device for conducting signal flux, comprising:
 at least one pole with two magnetic layers,
 a first of said magnetic layers having magnetic domains oriented to conduct said signal flux by rotation in a first direction,
 a second of said magnetic layers having magnetic domains oriented to conduct said signal flux by rotation in a second direction different from said first direction, and
 said layers being coupled to each other to cause said signal flux to pass therebetween and follow said first and second directions so that said signal flux conducts by rotation through said pole.

23. The device of claim 22, wherein said first direction and said second direction are perpendicular to each other, said layers being separated from each other to avoid flux conduction between said magnetic domains of said first and second layers when said signal flux is absent.

24. The device of claim 22, wherein said first and second directions are oriented obliquely to each other and said layers are coupled together to allow flux conduction between said magnetic domains of said layers when said signal flux is absent.

25. The device of claim 22, further comprising at least one additional magnetic layer having magnetic domains oriented parallel to the domains of said first layer, said first layer and said additional layer being coupled together to allow flux conduction between said magnetic domains of said layers when said signal flux is absent.

26. The device of claim 22, comprising at least two additional magnetic layers, one of said additional layers having magnetic domains oriented parallel to the domains of said first layer and being coupled to said first layer to allow flux conduction between said magnetic domains when said signal flux is absent, and
 a second of said additional layers having magnetic domains oriented parallel to the domains of said second magnetic layer and being coupled to said second layer to allow flux conduction between said magnetic domains when said signal flux is absent, and wherein said first magnetic layer and said second magnetic layer are separated from each other to avoid flux conduction between said magnetic domains of said first and second layers when said signal flux is absent.

27. The device of claim 22, further comprising a second magnetic pole, said poles stacked one on top of the other.

28. The device of claim 22, further comprising a second pole where said poles lie adjacent to each other in one plane.

29. A magnetic device for conducting signal flux, comprising:
 at least two magnetic layers,
 a first of said magnetic layers having magnetic domains oriented to conduct flux by rotation in a first direction,
 a second of said magnetic layers having magnetic domains oriented to conduct flux by rotation in a second direction different from said first direction,
 said layers being coupled to each other to cause said signal flux to pass between them and follow said first and second directions so that said signal flux conducts by rotation through said device.

30. The device of claim 29, wherein said layers are separated from each other to avoid flux conduction between said magnetic domains of said first and second layers when said signal flux is absent.

31. The device of claim 29, wherein said layers are coupled together to allow flux conduction between said magnetic domains of said first and second layers when said signal flux is absent.

32. The device of claim 29, wherein said first layer comprises two parallel magnetic layers.

33. The device of claim 29, wherein said second layer comprises two parallel magnetic layers.

34. The device of claim 29, wherein said first layer comprises two parallel magnetic layers and said second layer comprises two parallel magnetic layers.

35. The device of claim 34, wherein said first layer is separated from said second layer that the at rest domain state of each is independent of the to avoid flux conduction between said magnetic domains of said first and second layers when said signal flux is absent.

36. The device of claim 34, wherein said first layer and said second layer are coupled together to allow flux conduction between said magnetic domains of said layers when said signal flux is absent.

37. The device of claim 29, wherein said magnetic domains of said first and second layers are oriented so that said first and second directions are perpendicular to each other.

38. The device of claim 29, wherein said magnetic domains of said first and second layers are oriented so that said first and second directions are oblique to each other.

39. The device of claim 29 wherein each of said layers comprises a magnetic pole of a magnetic transducer for conducting said signal flux rom a storage medium to a yoke section of said transducer, said magnetic poles being coupled together in said yoke section, said poles having tips that are stacked one upon the other, separated by a gap, and arranged to be disposed adjacent to said storage medium.

40. The device of claim 29 wherein each of said layers comprises a magnetic pole of a magnetic transducer for conducting said signal flux from a storage medium to a yoke section of said transducer, said magnetic poles being coupled together in said yoke section, said poles having tips that are separated by a gap and arranged to be disposed adjacent to said storage medium, said poles being disposed in a common plane.

41. A method for making a magnetic conduction device, comprising the steps of:
   (a) configuring a first magnetic layer with magnetic domains oriented to enable said first layer to conduct signal flux in a first direction by rotation of said domains,
   (b) configuring a second magnetic layer with magnetic domains oriented to cause said first layer to conduct said signal flux in a second, different direction by rotation of said domains, and
   (c) coupling said layers to each other to cause said signal flux to pass therebetween and follow said first and second directions so that said signal flux conducts by rotation through said device.

42. The method of claim 41, further comprising separating said layers from each other to avoid flux conduction between said magnetic domains of said first and second layers when said signal flux is absent.

43. The method of claim 41, further comprising performing said coupling so that said layers are coupled together to allow flux conduction between said magnetic domains of said layers when said signal flux is absent.

44. The method of claim 41, wherein step (a) includes the steps of configuring a plurality of parallel magnetic sublayers in said first layer, and coupling said sublayers together to allow flux conduction between magnetic domains of said sublayers when said signal flux is absent.

45. The method of claim 44, wherein step (b) includes the steps of configuring a plurality of parallel magnetic sublayers in said second layer, and coupling said sublayers together to allow flux conduction between said magnetic domains of said sublayers when said signal flux is absent.

46. The method of claim 41, wherein step (b) includes the steps of configuring a plurality of parallel magnetic sublayers in said second layer, and coupling said sublayers together to allow flux conduction between said magnetic domains of said sublayers when said signal flux is absent.

47. The method of claim 41, wherein said first and second layers comprises a pole of a magnetic head disposed along a first axis, and further including orienting said first direction along said first axis and orienting said second direction perpendicular to said first axis.

48. The method of claim 41, wherein said first and second layers comprise a pole of a magnetic head disposed along a first axis, and further comprising orienting said first direction at an oblique angle relative to said first axis and orienting said second direction at an opposite oblique angle relative to said first axis.

49. The method of claim 41, further including disposing said first magnetic layer upon a substrate by vacuum deposition.

50. The method of claim 49, further including depositing a gap layer upon said first magnetic layer.

51. The method of claim 50, further including forming said second magnetic layer upon said gap layer.

52. The method of claim 51, wherein said deposition includes dry deposition.

53. The method of claim 51, wherein said deposition includes plating.

54. The method of claim 50, wherein said gap layer includes ceramic material.

55. The method of claim 41 further comprising annealing said first magnetic layer.

56. The method of claim 41 further comprising forming said first magnetic layer from a material having a crystal axis, said magnetic domains being oriented along said crystal axis.

57. The method of claim 41 further comprising disposing said first layer along a longitudinal axis and orienting said magnetic domains thereof to conduct said signal flux by rotation along said longitudinal axis.

58. The method of claim 57 further comprising disposing said second layer along said longitudinal axis and orienting said magnetic domains thereof to conduct said signal flux by rotation in a direction transverse to said longitudinal axis.

59. The method of claim 41 further comprising orienting said domains of said first magnetic layer by magnetostriction.

60. The method of claim 41 further comprising orienting said domains of said first magnetic layer by applying a magnetic field to said first magnetic layer.

61. The method of claim 41 further comprising forming said first magnetic layer from a plurality of laminated layers having magnetic domains oriented in parallel.

62. A method of flux conduction comprising providing a magnetic structure configured to conduct flux generally along a longitudinal axis in a plane of said structure, and
   orienting at least one component of anisotropy in said structure in a direction selected to cause some of said flux to conduct by rotation in said plane in a direction transverse to said longitudinal axis.

63. A device for conducting flux, comprising:
   a flux conduction structure configured to conduct flux generally along a longitudinal axis in a plane of said structure,
   said structure having a preferred rest state of magnetization that is oriented in a direction that causes some of said flux to conduct by rotation in said plane in a direction transverse to said longitudinal axis.

64. A method for conducting signal flux by rotation generally along a selected direction through a magnetic structure, comprising the steps of
   providing said structure with a magnetic rest state orientation, and arranging said magnetic rest state orientation to provide a plurality of differently directed paths for conducting signal flux by rotation through said structure.

65. A method for conducting signal flux by rotation generally along a selected direction through a magnetic structure, comprising the steps of
providing said structure with a magnetic rest state orientation perpendicular to a plane of the structure, and
arranging said magnetic rest state orientation to provide a plurality of differently directed paths for conducting signal flux by rotation through said structure.

66. The method of claim 50, wherein said gap layer has a thickness of between 300 and 2,000 angstroms.

67. The method of claim 50, wherein said gap has a thickness of between 300 and 2,000 angstroms.

68. The device of claim 10 wherein said first plurality of magnetic domains are oriented perpendicularly to said first direction.

69. The device of claim 10 wherein said first plurality of magnetic domains are oriented obliquely to said first direction.

70. The device of claim 11 wherein said second plurality of magnetic domains are oriented perpendicularly to said second direction.

71. The device of claim 11 wherein said second plurality of magnetic domains are oriented obliquely to said second direction.

72. The device of claim 1 wherein said first direction is oriented along a longitudinal axis and said second direction is oriented transversely to said longitudinal axis, whereby said flux is caused to conduct by rotation along said first direction by said first region and said second region permits said flux to spread transversely to said longitudinal axis while conducting by rotation.

73. The device of claim 72 wherein said second direction is perpendicular to said first direction.

74. The device of claim 1 wherein said first and second directions are oriented at opposite oblique angles with respect to a longitudinal axis, whereby said first and second regions conduct said flux generally along said longitudinal axis while allowing said flux to spread transversely to said longitudinal axis by an amount defined by said oblique angles.

75. The device of claim 1 wherein said first plurality of magnetic domains are disposed in a first magnetic layer and said second plurality of magnetic domains are disposed in a second magnetic layer, said first magnetic layer having a thickness that is greater than a thickness of said second magnetic layer.

76. The device of claim 22 wherein said first magnetic layer has a thickness that is greater than a thickness of said second magnetic layer.

77. The method of claim 41 further comprising forming said first magnetic layer with a thickness that is greater than a thickness of said second magnetic layer.

78. The method of claim 62 wherein said transverse direction is perpendicular to said longitudinal axis.

79. The method of claim 62 wherein said transverse direction is oblique to said longitudinal axis.

80. The device of claim 63 wherein said transverse direction is perpendicular to said longitudinal axis.

81. The device of claim 63 wherein said transverse direction is oblique to said longitudinal axis.

82. The method of claim 64 wherein a first one of said paths is disposed along said selected direction and a second one of said paths is disposed perpendicularly thereto.

83. The method of claim 64 wherein said paths are disposed at opposite oblique angles with respect to said selected direction.

* * * * *